US006810138B1

(12) United States Patent
Schanz

(10) Patent No.: US 6,810,138 B1
(45) Date of Patent: Oct. 26, 2004

(54) PROCESS AND DEVICE FOR GENERATING TEST PATTERNS WHEN APPLYING SOLDER PASTE BY A SCREEN PRINTING PROCESS ON PRINTED CIRCUIT BOARDS

(75) Inventor: Karl Schanz, Heilbronn (DE)

(73) Assignee: Ekra Eduard Kraft GmbH (DE)

( * ) Notice: Subject to any disclaimer, the term of this patent is extended or adjusted under 35 U.S.C. 154(b) by 0 days.

(21) Appl. No.: 09/446,830

(22) PCT Filed: Apr. 28, 1998

(86) PCT No.: PCT/EP98/02496

§ 371 (c)(1),
(2), (4) Date: Feb. 28, 2000

(87) PCT Pub. No.: WO99/02021

PCT Pub. Date: Jan. 14, 1999

(30) Foreign Application Priority Data

Jul. 2, 1997 (DE) .......................... 197 28 144

(51) Int. Cl.$^7$ ................................ G06K 9/00
(52) U.S. Cl. ......................... 382/144; 382/145
(58) Field of Search ................... 382/141, 144, 382/145, 146, 147, 149; 356/237.1, 237.4; 250/559.46; 348/87, 88, 125, 126

(56) References Cited

U.S. PATENT DOCUMENTS 5,060,063 A    10/1991   Freeman .................. 358/101
5,912,984 A *  6/1999   Michael et al. .......... 382/149

FOREIGN PATENT DOCUMENTS

| DE | 3928527 | 3/1991 | ................ 15/16 |
| DE | 4239995 | 6/1994 | |
| EP | 0379013 | 7/1990 | |
| EP | 0394568 | 10/1990 | ................ 13/8 |
| EP | 0786702 | 7/1997 | |

OTHER PUBLICATIONS

DEK Printing Machines Ltd., Ericsson 265 Gsx Product Update, Sep. 1995, vol. 2.

DEK Printing Machines Ltd., DEK 265 GSX, Engineering Specification, pp. 2–39.

DEK 2$^{nd}$ Inspection Manual, Issue 2, Jun. 1996, pp. 3–38.

DEK Printing Machines Ltd., DEK 265 GSx.

* cited by examiner

Primary Examiner—Vikkram Bali
(74) Attorney, Agent, or Firm—Ostrolenk, Faber, Gerb & Soffen, LLP

(57) ABSTRACT

The invention relates to a method and an apparatus for generating test patterns during the application of solder paste to printed circuit boards by means of the screen-printing process, a structure being optically recorded as a reference pattern in a teach-in method step and this recording being used to generate reference data for the test patterns. It is provided that the printing stencil for the screen-printing process is optically recorded as the structure.

45 Claims, 3 Drawing Sheets

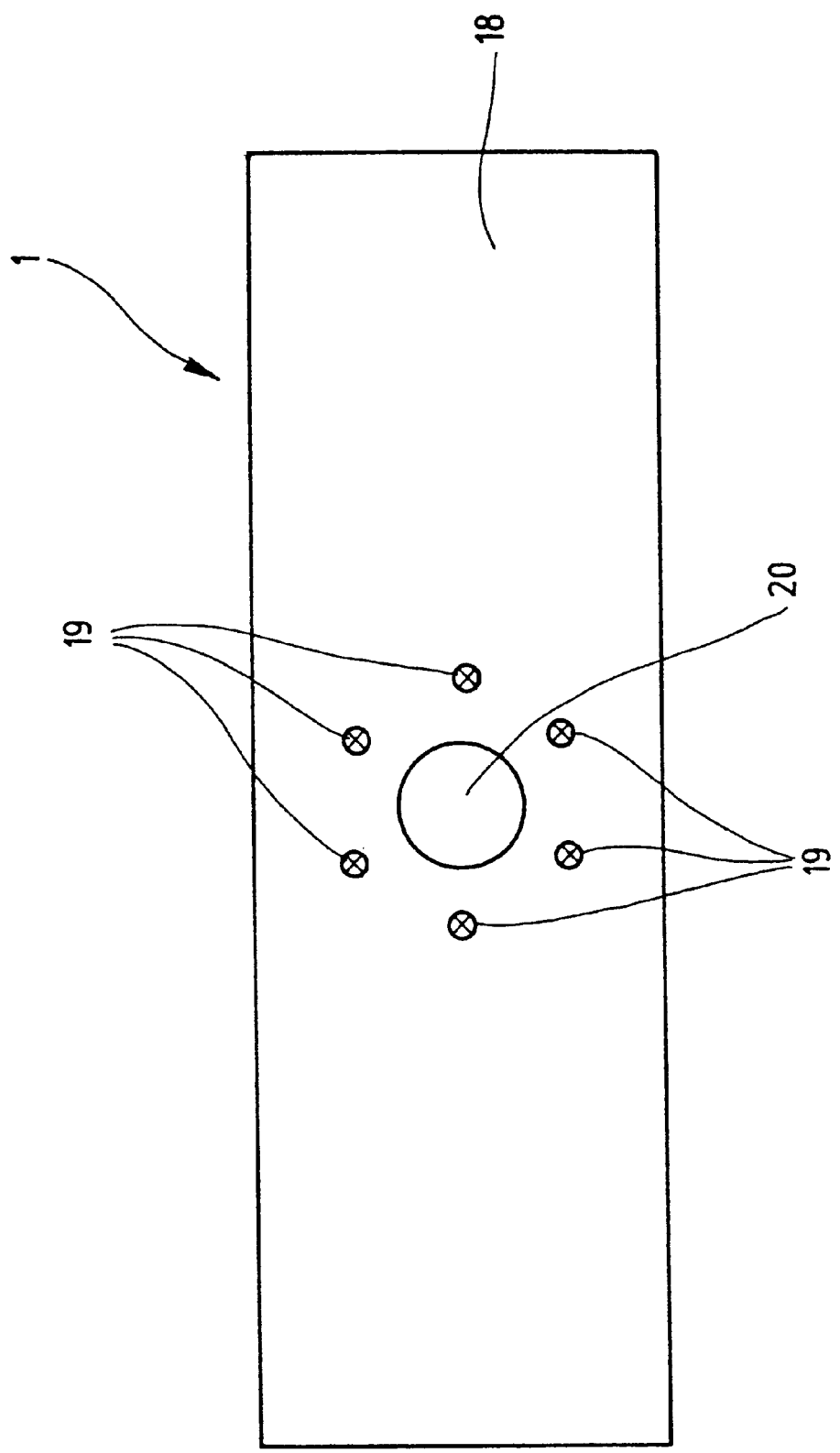

PROCESS AND DEVICE FOR GENERATING TEST PATTERNS WHEN APPLYING SOLDER PASTE BY A SCREEN PRINTING PROCESS ON PRINTED CIRCUIT BOARDS

CROSS REFERENCE TO RELATED APPLICATION

This application is based on, and claims priority to International Application No. PCT/EP98/02496, filed 28 Apr. 1998, which, in turn, is based on German Application No. 197 28 144.3, filed 2 Jul. 1997.

BACKGROUND OF THE INVENTION

1. Field of the Invention

The invention relates to a method of generating test patterns during the application of solder paste to printed circuit boards by means of the screen-printing process, a structure being optically recorded as a reference pattern in a teach-in method step and this recording being used to generate reference data for the test patterns.

2. Description of Related Art

It is known within the functions of an inspection system to monitor the adequacy of the application of solder paste to printed circuit boards. The solder paste is applied to the printed circuit boards by the screen-printing printing process. It makes it possible in the subsequent component fitment process to solder electronic components to trace terminals formed on the printed circuit boards. This takes place in particular by the SMD process. To be able to check the application of the solder paste in the course of the inspection system, it is necessary to provide so-called test patterns. These define where and how the check on the application of solder paste is to be carried out. The test patterns define the coordinates, size and shape of the solder paste regions to be applied. To obtain test patterns, there are basically two known methods. The first method obtains the test patterns from CAD data. These are stencil data available in electronic form (Gerber files) of the printing stencil. These data provide information on where and how the printing stencil has openings through which solder paste is applied to the printed circuit board in the screen-printing process. Owing to problems with the availability, up-to-dateness and convertibility of the CAD data, the subsequently mentioned second method has been found to be the more practicable solution in the past this second method is a so-called teach-in method, in which the printed circuit board serves as a reference pattern for test pattern generation. Consequently, the trace and terminal structure of a printed circuit board is recorded by means of a camera and the test patterns are determined in this way in the teach-in method. One disadvantage is that the structures of traces—as a result of their production process—have relatively great dimensional tolerances with the result that the generation of test patterns is subject to dimensional deviations. In particular in the case of contact structures which are very close together, for example for large-scale-integration components, the dimensional inadequacy may cause a problem.

The invention is therefore based on the object of specifying a method of the type mentioned at the beginning which produces high-precision results and can be carried out in a practicable way.

BRIEF SUMMARY OF THE INVENTION

This object is achieved according to the invention by the printing stencil for the screen-printing process being optically recorded as the structure. Consequently, according to the invention, the printing stencil is used in the teach-in method as a reference pattern for the generation of test patterns. It will, of course, be understood by those skilled in the art that the reference pattern, which is made from the printing stencil before initial use, thus results in test data which correspond exactly to the intended conditions existing in the printing process, with the result that the print quality and dimensional stability can be optimally assessed independently of other influences. The measured print quality of the solder paste application allows direct conclusions to be drawn concerning the printing process, without disturbing factors occurring—such as the previously mentioned tolerance influences for example.

In order to generate the test patterns, preferably certain regions—which are particularly susceptible with regard to any defects—are specified and the test patterns are generated in these regions by means of optical recording of the structure (stencil openings) of the new printing stencil. The optically recorded image is converted electronically into data, which represent the test patterns.

These test patterns form the reference pattern, which is compared—after the screen-printing process—with the likewise optically determined data of the actual solder paste application. This allows defects to be identified, for example, that two terminals of the printed circuit board are electrically connected by means of an undesired solder paste bridge.

It can also be identified whether solder paste is absent in certain regions. This in turn may have two reasons, on the one hand that the solder paste is sticking to the printing stencil, since the solder paste has not been transferred onto the printed circuit board, or on the other hand there is too little solder paste available, that is to say that it was not possible for the doctor blade to spread solder paste into all regions because there was insufficient available.

According to the previously known method, the solder paste application is optically recorded and compared with the test patterns obtained in the previous way. The comparison likewise takes place in the case of the subject of the invention, with the addition that the printing stencil is likewise optically sensed—because of the generation of the test patterns.

Consequently, both the printing stencil and the printed circuit board are assigned an optoelectronic recording device, which offers the following, previously unattainable advantages. It is possible to compare electronically, preferably automatically, the images obtained from the printing stencil and the printed circuit board, it being possible for defects or developing defects to be identified and possibly stopped in advance.

For instance, bridges usually only build up slowly, that is to say that it becomes evident on the printing stencil, in particular at the edges of the printing stencil openings, that particles of the solder paste are increasingly collecting there and building up over the course of time, until the formation of a bridge occurs. This progressive build-up is identified as it occurs from the optoelectronic sensing of the printing stencil and can therefore be stopped. This preferably takes place automatically, in that the printing process is briefly interrupted and a cleaning of the printing stencil is automatically carried out.

The same applies correspondingly to solder paste which sticks in the openings of the printing stencil and is therefore not transferred onto the printed circuit board, since in this case as well initially only slight amounts remain sticking to the stencil openings in a developing process and these amounts slowly build up until finally the paste clogs the entire opening or a large part of the opening. The optical sensing of the printing stencil is consequently used in two respects, on the one hand for the generation of the test patterns and on the other hand for the identification of defects. In addition to the simple generation of the test pattern by means of the procedure according to the invention, it is thus possible to carry out an optimum check with regard to possible defects during the screen-printing process.

It is preferably provided that the stencil openings of the printing stencil are optically recorded with regard to their position (coordinates) and/or their geometry (shape, size). The test patterns accordingly have corresponding information, that is on the position (coordinates) and the geometry (shape, size).

Furthermore, it is advantageous if the side of the printing'stencil facing the printed circuit board is optically recorded. The recording of the "underside" has the advantage that it can best be identified there—in addition to the recording of the test pattern data—whether defects can occur in the course of the progressing printing process, for example the bridge formation or sticking of solder paste mentioned.

According to a development of the invention, it is provided that, after the screen-printing process, an optical recording of the solder paste application which has taken place onto the printed circuit board is carried out and that actual data are generated from this recording. With the aid of these actual data, an assessment of the solder paste application is possible in the course of the inspection system in a particularly simple way, since it is merely necessary to carry out a comparison of the data of the reference pattern with the actual data. Consequently, an evaluation of the actual data is performed with the reference data taken into consideration.

The invention also relates to an apparatus for generating test patterns during the application of solder paste to printed circuit boards by means of the screen-printing process, having a first optoelectronic device for recording a structure as a reference pattern, taking place in a teach-in method step, and having data processing electronics for generating reference data from the reference pattern recording, the first optoelectronic device being arranged in such a way that it records the printing stencil as the structure. This optoelectronic device consequently obtains in an optical way, by sensing the structure (stencil openings) of the printing stencil, test pattern data, which are available as desired data in the evaluation of the solder paste application. These desired data are compared with actual data determined from the solder paste application. If there are deviations, corrections can be made.

It is advantageous if there is a displacing device, by which the first optoelectronic device can be made to enter between the printing stencil and the printed circuit board. This allows the respectively desired region of the printing stencil to be optically recorded.

There is advantageously provided a second optoelectronic device, for recording the solder paste application on the printed circuit board, it being particularly provided that the first and second optoelectronic devices can be moved by means of the same displacing device. This has the advantage that only one displacing device is required for both optoelectronic devices, with the result that structural complexity and costs can be reduced. The displacing of the optoelectronic devices by means of one and the same displacing device also has the advantage, however, that both devices are always brought into the same position with regard to the printing stencil and with regard to the printed circuit board, that is to say that the two optoelectronic devices always determine corresponding regions of the two parts, with the result that a desired-actual comparison is made possible in a particularly simple way.

Furthermore, it may be provided that the first and second optoelectronic devices are formed by only one optoelectronic apparatus, which can be switched over with regard to the recording direction or has two recording beams. Consequently, the two optoelectronic devices are combined in a single optoelectronic apparatus which is located on the displacing carriage of the displacing device. The complexity is reduced if the recording direction can be switched over, that is to say that the printing stencil and—after switching over—the printed circuit board are recorded by means of one and the same optoelectronics. To be able to perform a desired-actual comparison, it is then necessary that the image structure recorded first is stored and is then compared with the image structure subsequently recorded. Structurally rather more complex, but more advantageous from a process engineering viewpoint, is the configuration using two optoelectronic recording devices (cameras), one inspecting the printing stencil, by means of a first recording beam, and the other inspecting the printed circuit board, and consequently the solder paste application which has taken place there, by means of a second recording beam.

Furthermore, it may be provided that the optoelectronic apparatus has a first mirror, which has been made reflective on both sides and one side of which lies in the beam leading to the printing stencil and the other side of which lies in the beam leading to the printed circuit board. In particular, this first mirror which has been made reflective on both sides is in the form of a prism, which has the advantage that the plane of reflection is virtually the same for both beams.

A development of the invention provides that each side of the first mirror is assigned a semi-transparent, second and third mirror, respectively. The second and third mirrors are in each case assigned in particular first and second optics, respectively. The second and third mirrors are preferably in each case assigned a first and second image recording sensor, respectively. The arrangement is in this case preferably set up in such a way that the first optics lie between the second mirror and the first image recording sensor and the second optics lie between the third mirror and the second image recording sensor. The set up explained above makes it possible that the printed circuit board can be recorded via one side of the first mirror and the semi-transparent second mirror and also the first optics and with the aid of the first image recording sensor and that the printing stencil can be recorded with the aid of the other side of the first mirror, the third mirror and also the second optics and the second image recording sensor.

A first source of illumination interacts with the second mirror and a second source of illumination interacts with the third mirror, making it possible to illuminate the printed circuit board with the aid of the first source of illumination via the second mirror and the first mirror and to illuminate the printing stencil by means of the second source of illumination via the third mirror and the first mirror. Particularly good results can be achieved by the printed circuit board being subjected to light of an annular or approximately annular or part-annular third source of illumination. The third source of illumination is preferably located on the optoelectronic apparatus which can be moved by means of the displacing device. In particular, it is provided that, on account of its annular structure, the third source of illumination surrounds the beam between the first mirror and the printed circuit board, that is to say that optimum illumination of the printed circuit board takes place, with the result that the solder paste application on it can be optically recorded very well.

Finally, it is provided that the third source of illumination is formed by a plurality of light-emitting diodes (LEDs).

BRIEF DESCRIPTION OF THE DRAWINGS

The drawings illustrate the invention on the basis of an exemplary embodiment, to be precise:

FIG. 3 shows a view from below of the optoelectronic apparatus in the direction of the arrow III in FIG. 2.

DETAILED DESCRIPTION OF THE INVENTION

Figure 1:
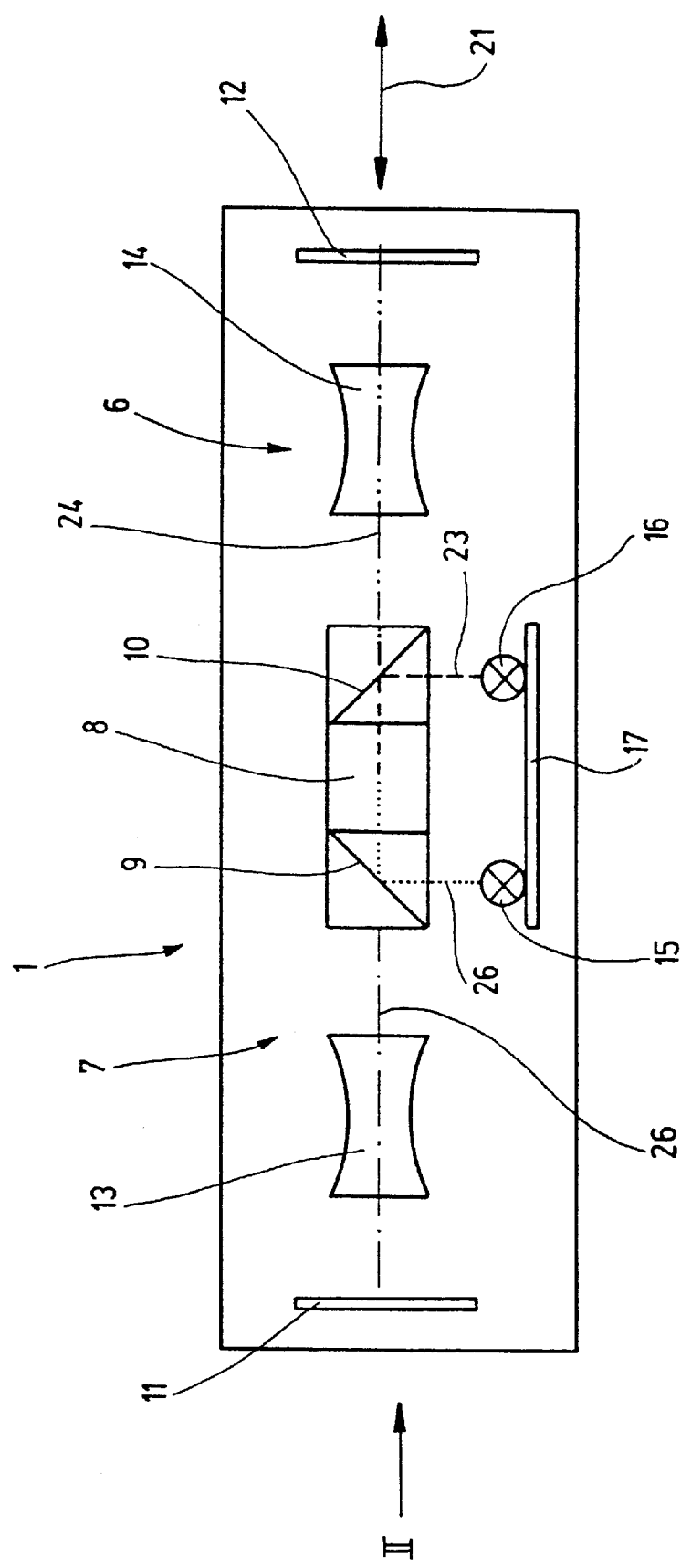
FIG. 1 shows a plan view of the optoelectronic apparatus
Figure 2:
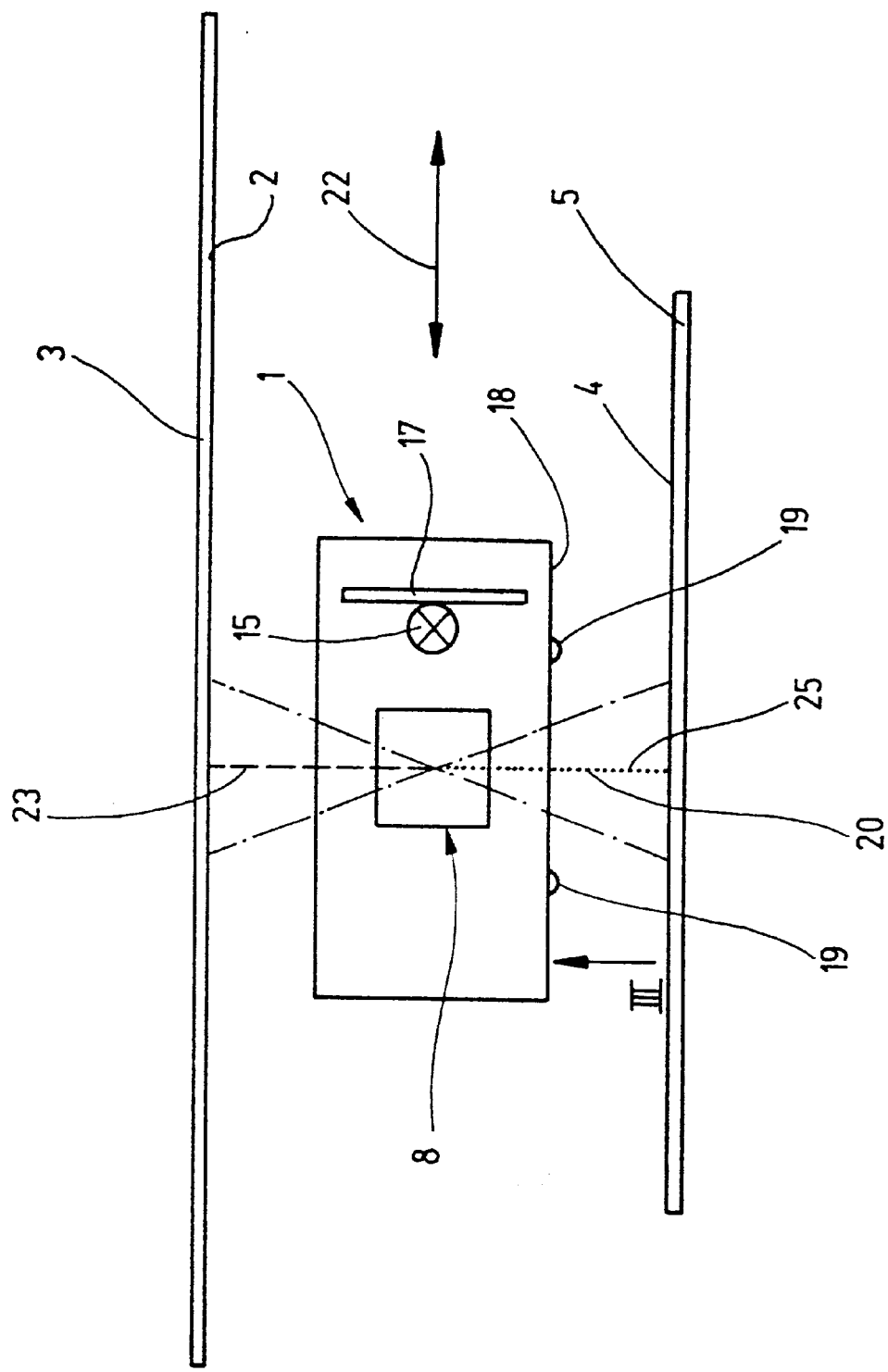
FIG. 2 shows an end-on, view of the optoelectronic apparatus in the direction of the arrow II in FIG. 1

FIGS. 1 to 3 show—in diagrammatic representation—an optoelectronic apparatus 1, with the aid of which test patterns can be generated during the application of solder paste to printed circuit boards by means of the screen-printing process. Furthermore, this optoelectronic apparatus 1 is suitable for the inspection of the underside 2 of a printing stencil 3, used in the screen-printing process, as well as the side 4 of the printed circuit board 5 onto which the solder paste is applied in the screen-printing process (FIG. 2).

According to FIG. 1, the optoelectronic apparatus 1 has a first optoelectronic device 6 and a second optoelectronic device 7. The two optoelectronic devices 6 and 7 share a first mirror 8, which has been made reflective on both sides and is assigned a semi-transparent, second mirror 9 of the optoelectronic device 7 and a semi-transparent, third mirror 10 of the optoelectronic device 6. Furthermore, the optoelectronic device 7 has a first image recording sensor 11 and the optoelectronic device 6 has a second image recording sensor 12. Between the second mirror 9 and the first image recording sensor 11 there are first optics 13. Arranged between the third mirror 10 and the second image recording sensor 12 there are second optics 14. Consequently, the first optics 13 are a component part of the second optoelectronic device 7 and the second optics 14 are a component part of the first optoelectronic device 6. The optoelectronic device 7 also has a first source of illumination 15; the optoelectronic device 6 is assigned a second source of illumination 16. The two sources of illumination 15 and 16 are preferably designed as LEDs and are located on a printed circuit board 17.

According to FIG. 2, on the underside 18 of the optoelectronic apparatus 1 there is arranged a third source of illumination 19, which comprises a plurality of light-emitting diodes (LEDs) arranged in the form of a ring. The arrangement is set up in such a way that the third source of illumination 19 surrounds the beam 20, i.e., the optical path, between the first mirror 8 and the printed circuit board 5. This is illustrated in particular by FIG. 3.

By means of a displacing device (not shown), which operates in the manner of a carriage and can move along two mutually perpendicular coordinates, the optoelectronic apparatus 1 can be moved along the double-headed arrow 21 in FIG. 1 and along the double-headed arrow 22 in FIG. 2, that is to say that it can be moved into any desired position with respect to the printing stencil 3 and into the corresponding position with respect to the printed circuit board 5. This takes place as soon as solder paste has been applied by means of the printing stencil 3 to the side 4 of the printed circuit board 5 in the screen-printing process. After this screen-printing process, the printing stencil 3 and the printed circuit board 2 are moved apart, with the result that the optoelectronic apparatus 1 can enter the intermediate space. In this way, an inspection is possible with regard to the adequacy of the solder paste application. In this inspection, the underside 2 of the printing stencil 3 is inspected by means of the first optoelectronic device 6 and the side 4 of the printed circuit board 5 is inspected by means of the second optoelectronic device 7.

By means of processing electronics (not shown), it is possible in this way to check the solder paste application for any defects. The specific procedure is as follows: Light is cast onto the semi-transparent mirror 10 by means of the source of illumination 16 (dashed line 23), this light being deflected through 90° and sent to the first mirror 8 and directed upwards from one side of this mirror 8, with the result that it hits the underside 2 of the printing stencil 3. Light reflected by the printing stencil 3 passes back to the mirror 8 and is sent from the same side of the latter to the mirror 10, the mirror 10 being passed in a straight line and the reflected light according to the dash-double-dotted line 24 passing via the optics 14 to the image recording sensor 12. In interaction with the data processing electronics (not shown), the said image recording sensor can consequently generate in a pixel structure a corresponding image of the structure, in particular the coordinates, shape and size of the stencil openings, of the printing stencil 3. The data thus determined can be used for the aforementioned comparison with the solder paste application. In particular, it is possible for the recorded data to be evaluated as a reference pattern, that is to say that this reference pattern represents test patterns, that is information on which position and which geometry the stencil openings of the printing stencil have. The recording takes place in the so-called teach-in method.

By means of the second optoelectronic device 7, the solder paste application on the side 4 of the printed circuit board 5 can be inspected. For this purpose, light is directed from the source of illumination 15 to the mirror 9 (dotted line 25), where it is deflected and sent to the other side of the first mirror 8, which casts the light downwards onto the circuit board 5. The light reflected by the printed circuit board 5, in particular by the solder paste application, passes back to the mirror 8 and is sent from there to the semi-transparent mirror 9, which is passed through in a straight line, with the result that the light passes along the dash-dotted line 26 via the optics 13 to the image recording sensor 11. The image recording sensor 11 provides information—in pixel form—on the success of the application of solder paste to the printed circuit board 5. It is then possible by means of the data processing electronics to evaluate the information of the two image recording sensors 11 and 12, that is to say that the reference pattern of the printing stencil 3 is compared with the actual pattern, that is the solder paste application on the printed circuit board 5, whereby any defects can be identified. It is additionally possible, by means of the first optoelectronic device 6, to inspect the printing stencil 3 for any soiling, with solder paste collecting there, with the result that defects resulting from such sticking accumulations of solder paste can be identified at an early time.

If a defect is discovered, automatic operation can be stopped and the defect can be visually displayed on a screen. The operator has the possibility of ignoring the defect or taking measures. It is also possible to remove the then defective printed circuit board. In any event, the defect is recorded with the name of the component which is to be applied by means of the solder paste application to the printed circuit board, together with the response on the part of the operator.

What is claimed is:

1. Apparatus for checking the application of solder paste to printed circuit boards by a screen-printing process using a printing stencil, the apparatus comprising:

an optoelectronic apparatus operative to scan the positions and/or the sizes and shapes of openings in a printing stencil before initial use as a teach-in procedure, to generate an image thereof as a reference pattern, the optoelectronic apparatus further being operative to scan a surface of a printed circuit board to which solder paste has been applied using the printing stencil to generate an image consisting substantially of a pattern of solder paste applied to a surface thereof thereby to provide a production test pattern; and a data processing unit operative to convert the reference pattern image into electronic reference data, and to convert the production test pattern image into electronic production pattern data, the data processing unit being further operative to directly compare the production pattern data and the reference pattern data to determine conformity of an actual pattern of application of solder paste to a desired pattern of application.

2. A device according to claim 1, wherein the optoelectronic apparatus includes:

a first optoelectronic device operable to scan the printing stencil; and a second optoelectronic device operable to scan the surface of the printed circuit board to which solder paste has been applied.

3. A device according to claim 2, wherein the first and second optoelectronic devices are formed as an integral unit of the optoelectronic apparatus, and which unit is switchable to scan in opposite directions to record the surface of the printing stencil or the printed circuit board.

4. A device according to claim 2, wherein the first and second optoelectronic devices are formed as an integral unit of the optoelectronic apparatus, and which unit provides two recording beams respectively operable to scan the surface of the printing stencil and the printed circuit board.

5. A device according to claim 2, further including a displacing device operable to move the first and second optoelectronic devices into and out of a space between a printing stencil and a printed circuit board to which solder paste has been applied.

6. A device according claim 2, wherein the first and second optoelectronic devices each include an optical unit, and an image recording sensor coupled with the optical unit.

7. A device according claim 2, wherein the optoelectronic apparatus includes:

a first source of illumination associated with the first optoelectronic device; and a second source of illumination associated with the second optoelectronic device.

8. A device according to claim 7, wherein the optoelectronic apparatus further includes a third source of illumination directed onto a printed circuit board when it is being scanned.

9. A device according to claim 8, wherein the third source of illumination provides a light pattern which substantially surrounds an optical path from the second optoelectronic device to the printed circuit board.

10. A device according to claim 9, wherein the light pattern provided by the third source of illumination is annular, approximately annular or part-annular.

11. A device according to claim 8, wherein the third source of illumination is formed by comprised of a plurality of light-emitting diodes.

12. A device according to claim 7, wherein the first and second sources of illumination are provided by light-emitting diodes.

13. A device according to claim 1, further including a displacing device operable to move the optoelectronic apparatus into and out of a space between a printing stencil and a printed circuit board to which solder paste has been applied.

14. A device according to claim 1, wherein the optoelectronic apparatus includes a first mirror which is reflective on both sides, one side of which lies in an optical path to a printing stencil and the other side of which lies in an optical path to a printed circuit board.

15. A device according to claim 14, wherein the optoelectronic apparatus includes semi-transparent second and third mirrors optically coupled with opposite sides of the first mirror.

16. A device according claim 15, wherein the optoelectronic apparatus includes first and second optical units respectively coupled with the second and third mirrors.

17. A device according to claim 16, wherein the optoelectronic apparatus includes first and second image recording sensors respectively coupled with the second and third mirrors.

18. A device according to claim 16, wherein the optoelectronics apparatus includes first and second sources of illumination respectively associated with the first and second optoelectronic devices.

19. A device according to claim 18, wherein:

the first source of illumination is associated with the second mirror; and the second source of illumination is associated with the third mirror.

20. A device according to claim 15, wherein the optoelectronic apparatus includes first and second image recording sensors respectively coupled with the second and third mirrors.

21. A device according to claim 1, wherein the optoelectronic apparatus includes first and second sources of illumination respectively directable at a surface of a printing stencil and at a surface of a printed circuit board while the surfaces are being scanned.

22. A device according to claim 21, wherein the optoelectronic apparatus further includes a third source of illumination directable at a surface of a printed circuit board while the surfaces is being scanned.

23. A device according to claim 22, wherein the third source of illumination provides a light pattern which substantially surrounds an optical path from the optoelectronic apparatus to the printed circuit board.

24. A device according to claim 23, wherein the third source of illumination is comprised of a ring of light-emitting diodes.

25. A device according to claim 1, wherein the optoelectronic apparatus is operable to scan the surface of the printing stencil intended to be in contact with the printed circuit board during application of solder paste.

26. A device according to claim 1, wherein the optoelectronic apparatus includes a first source of illumination directable at a surface of a printing stencil while it is being scanned.

27. A device according to claim 26, wherein the source of illumination is a light-emitting diode.

28. A method for checking the application of solder paste to printed circuit boards by a screen-printing process using a printing stencil, the method comprising the steps of:

generating an optical image of the positions and/or the sizes and shapes of openings in a printing stencil before initial use thereby to provide a reference test pattern for a teach-in-procedure;

converting the reference test pattern image into electronic reference pattern data;

generating an optical image consisting substantially of a pattern of solder paste applied to a surface of a printed circuit board using the stencil thereby to provide a production test pattern;

converting the production test pattern image into electronic production pattern data;

directly comparing the production pattern data and the reference pattern data to determine conformity of an actual pattern of application of solder paste to a desired pattern of application.

29. A method according to claim 28, wherein the reference pattern and production test pattern images are generated by optically scanning the surfaces of the printing stencil and the printed circuit board to which solder paste has been applied using respective first and second optoelectronic devices.

30. A method according to claim 29, wherein:
the first and second optoelectronic devices are formed as an integral unit operable to scan in opposite directions; and
the surfaces of the printing stencil and the printed circuit board are optically scanned by selectively activating the respective first and second optoelectronic devices.

31. A method according to claim 29, wherein the reference and production test pattern images are generated by scanning the surfaces of the printing stencil and the printed circuit board using recording beams provided by the respective first and second optoelectronic devices.

32. A method according to claim 29, further including the step of moving the first and second optoelectronic devices into and out of a space between a printing stencil and a printed circuit board to which solder paste has been applied to scan the respective surface thereof.

33. A method according to claim 29, further including the step of illuminating the surface of the printing stencil and the surface of the printed circuit board to which solder paste has been applied while the reference and production test pattern images are being generated using first and second light sources respectively associated with the first and second optoelectronic devices.

34. A method according to claim 33, wherein the first and second light sources are light-emitting diode devices respectively associated with the first and second optoelectronic devices.

35. A method according to claim 33, further including the step of illuminating the surface of the printed circuit board by a third light source.

36. A method according to claim 24, wherein the third light source provides a light pattern which substantially surrounds an optical path from the second optoelectronic device to the printed circuit board.

37. A method according to claim 35, wherein the third light source provides a light pattern which is annular, approximately annular or part-annular.

38. A method according to claim 35, wherein the third light source is comprised of a plurality of light-emitting diodes.

39. A method according to claim 28, wherein the step of generating the reference pattern image includes:
identifying selected portions of the opening of the printing stencil particularly susceptible to printing defects; and
scanning only the selected portions to generate the reference pattern image.

40. A method according to claim 28, wherein the reference pattern image is generated by optically scanning the surface of the printing stencil intended to be in contact with the printed circuit board during application of solder paste.

41. A method according to claim 28, further including the step of illuminating the surface of the printing stencil and the surface of the printed circuit board to which solder paste has been applied while the reference and the production test pattern images are being generated using first and second light sources respectively.

42. A method according to claim 41, wherein the first and second light sources are light-emitting diode devices.

43. A method according to claim 41, wherein the surface of the printed circuit board is further illuminated by a third light source.

44. A method according to claim 43, wherein the third light source is a comprised of one or more light-emitting diodes.

45. A method according to claim 43, wherein the third light source is comprised of a ring of light-emitting diodes.

* * * * *